United States Patent

Hoffsommer et al.

[19]

[11] Patent Number: 5,847,531
[45] Date of Patent: *Dec. 8, 1998

[54] PROCESS FOR REDUCING THE STRENGTH OF AN UNCONTROLLED POINTER MOVEMENT

[75] Inventors: Klaus Hoffsommer, Bietigheim-Bissingen; Roland Steger, Weil im Schönbuch; Bernhard Herzog, Stuttgart, all of Germany

[73] Assignee: Moto Meter GmbH, Leonberg, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 604,936

[22] PCT Filed: Jun. 20, 1995

[86] PCT No.: PCT/DE95/00790

§ 371 Date: Feb. 29, 1996

§ 102(e) Date: Feb. 29, 1996

[87] PCT Pub. No.: WO96/01412

PCT Pub. Date: Jan. 18, 1996

[30] Foreign Application Priority Data

Jul. 1, 1994 [DE] Germany .......................... 44 23 119.9

[51] Int. Cl.⁶ ..................................................... H02P 8/00
[52] U.S. Cl. .............................. 318/696; 116/47; 116/297
[58] Field of Search .................................. 318/696, 685; 324/160, 207.25; 116/47, 284, 288, 297; 346/90, 92

[56] References Cited

U.S. PATENT DOCUMENTS

| | | | |
|---|---|---|---|
| 3,581,174 | 5/1971 | Hammer | 318/266 |
| 3,870,274 | 3/1975 | Broe | 251/134 |
| 4,567,434 | 1/1986 | Lindig | 318/696 |
| 4,646,007 | 2/1987 | Faria | 324/146 |
| 4,709,196 | 11/1987 | Mizuta | 318/282 |
| 5,055,782 | 10/1991 | Kronenberg | 324/207.25 |
| 5,062,135 | 10/1991 | Ohike | 324/154 R |
| 5,333,371 | 8/1994 | Mittenbuhler et al. | 29/595 |

OTHER PUBLICATIONS

K. Mayer, "Der Schrittmotor and Seine Schrittdauer", Feinwerktechnik & Messtechnik 99, pp. 7–8, 1991.

Primary Examiner—David S. Martin
Attorney, Agent, or Firm—Kenyon & Kenyon

[57] ABSTRACT

A process for reducing the strength of an uncontrolled movement of a pointer driven by a stepper motor and abutting against a mechanical stop means when the stepper motor is switched off. Prior to the switch-off operation, the field strength of the magnetic field of the stepper motor is lowered, or the pointer is moved away from the stop means by a specified compensating angle of rotation. Alternatively, following the switch-off operation, the stepper motor is switched on again at least one time following a specified time span for a specified switch-on time span.

16 Claims, 6 Drawing Sheets

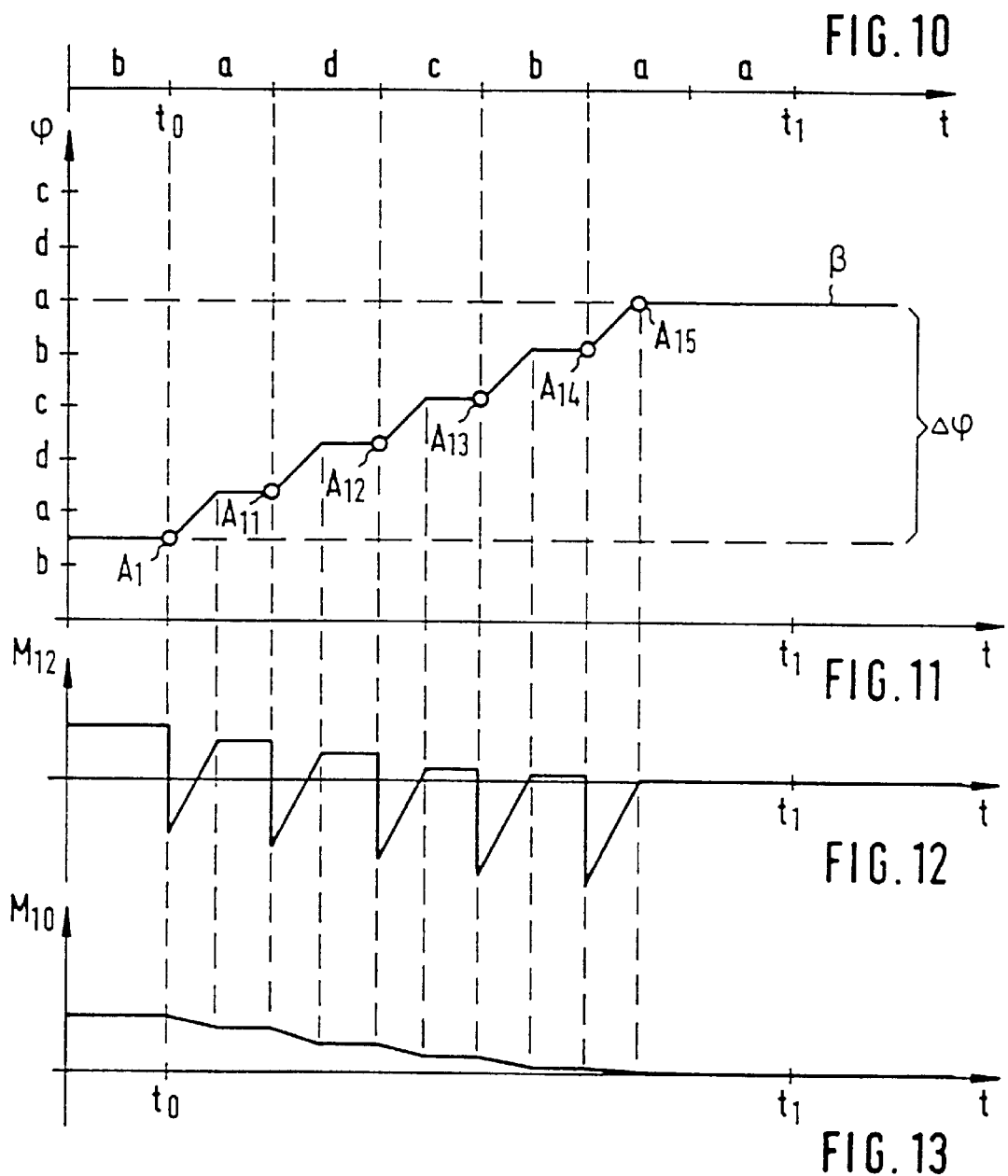
FIG. 10
FIG. 11
FIG. 12
FIG. 13
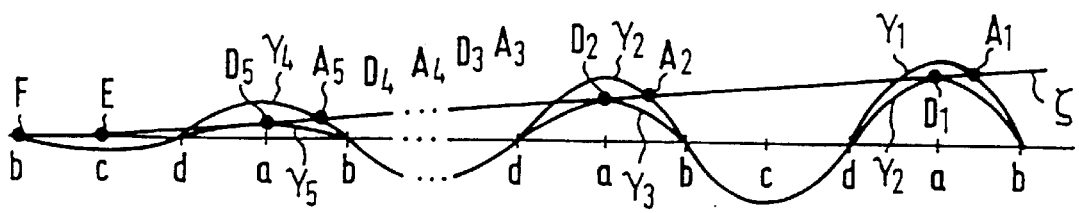
FIG. 14

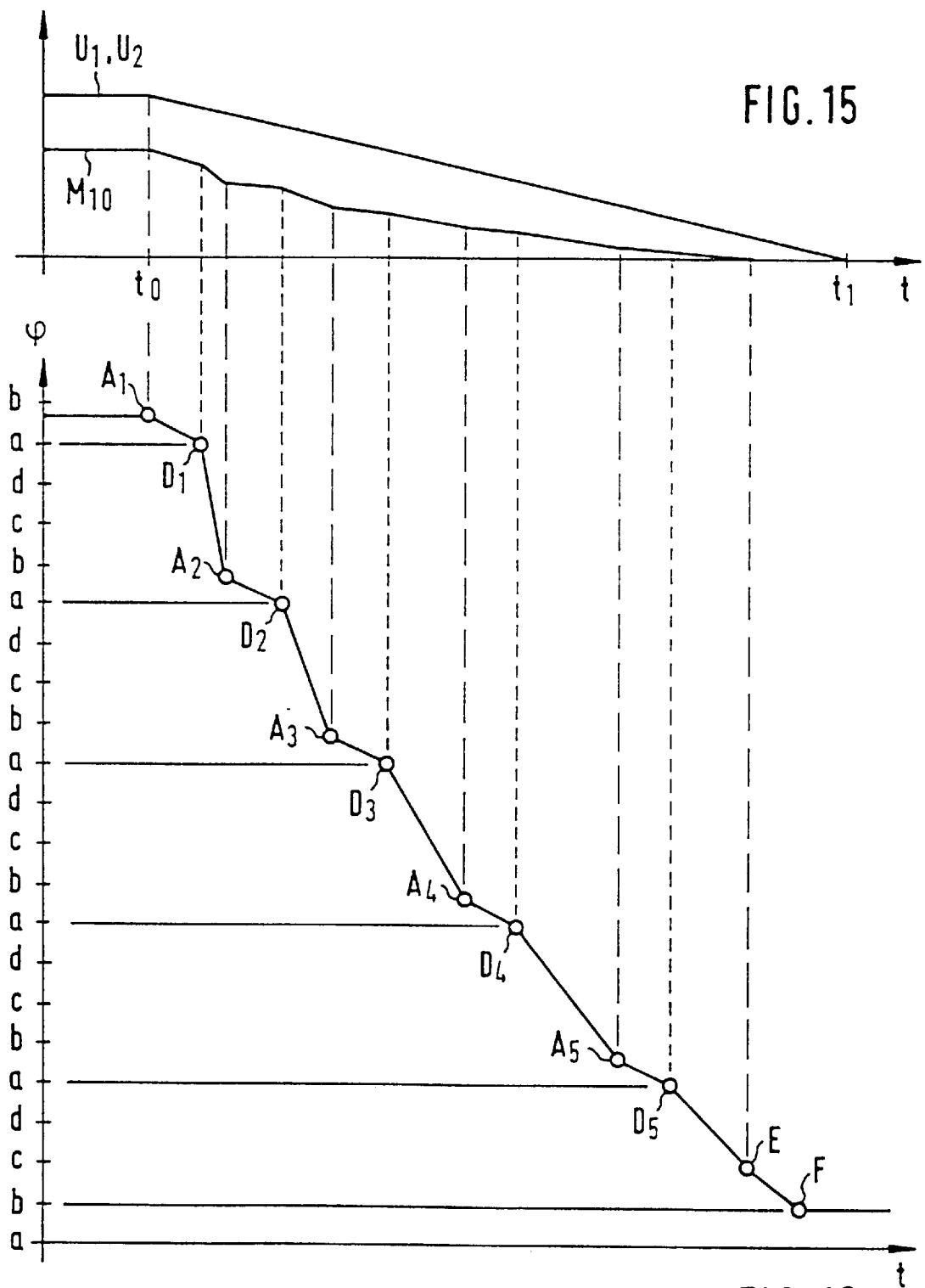

PROCESS FOR REDUCING THE STRENGTH OF AN UNCONTROLLED POINTER MOVEMENT

FIELD OF THE INVENTION

The present invention relates to a process for reducing the strength of an uncontrolled pointer movement.

BACKGROUND INFORMATION

The essay, "Der Schrittmotor und seine Schrittdauer" (The Stepper Motor and its Step Pulse Duration), Feinwerktechnik & Meβtechnik (Precision Engineering and Metrology) 99 (1991)7–8, pp. 327–332, by Klaus Mayer, discusses a stepper motor which has a permanent-magnetic rotor that is mounted on a motor axle and rotates within the rotating magnetic field of two coil systems. When a pointer is installed on the axle of the rotor, a specific angle of rotation can be adjusted by driving the stepper motor, and the angle of rotation can be indicated by the pointer over a dial. Such systems can be used, e.g., for displaying the rotational speed, velocity, and other vehicle-specific information in a motor-vehicle combination instrument. It is customary to provide a stop pin at the lower end of the scale as a mechanical stop for the pointer and, in particular, immediately after turning on the stepper motor, to drive the pointer against this stop means to obtain a defined initial position for the rotor of the stepper motor. When working with conventional stepper motors under the state of the art, the problem often occurs that the system comprised of the pointer and the stepper motor, it being possible to mount a speed-transforming gear between the pointer and the rotor, is mechanically strained, because when the mechanical components press against the stop means, they are elastically deformed by the rotor torque (rotation means). The cause of such deformations lies, above all, in the elasticity of the pointer and in the mechanical play of the speed-transforming gear. If the stepper motor is switched off after the stop means is hit, often the restraint (torque bias) of the system is abruptly released, so that the pointer jumps away from the stop means. The uncontrolled springing of the pointer off of the stop means can result in display errors. Also, subjectively, the person steering the vehicle usually perceives a pointer springing suddenly away from the stop means as an unpleasant sensation.

SUMMARY OF THE INVENTION

In contrast, the advantage of the process according to the present invention is that the strength (intensity) of such an uncontrolled pointer movement is reduced. The strength is understood to be the expected angle of rotation of the pointer when it jumps off of the mechanical stop means. As a result, one attains the advantage that the pointer driven by the stepper motor is situated at an exactly defined position even after a shut-off operation, so that the accuracy of the display and, thus, its readability is improved. Moreover, there is an improvement in the subjective perception of the pointer movement by the person reading the dial.

When the field strength is lowered, there is the further advantage that the process for reducing the strength of an uncontrolled pointer movement is able to be realized quite simply and cost-effectively, because the magnetic field strength of the drive coils is lowered.

The pointer movement has the advantage that because of the controlled rotation of the pointer away from the stop means, there can be no free rotation of the rotor by more than the minimum step angle, so that an especially smooth rotational performance of the rotor and, thus, of the pointer is attained.

The advantage of repeatedly switching on after switching off is that an especially simple driving of the stepper motor results from the principle of alternating switch-on and switch-off operations, which makes it possible to achieve a controlled interception (capture) of the rotor following the pointer moment of rotation to reduce the strength of the uncontrolled pointer movement.

By continuously lowering the field strength of the magnetic field of the drive coils, a very uniform rotor performance is produced and, thus, the torque acting on the pointer is relieved very uniformly, since the rotor moves in an especially jerk-free manner during the process.

In the same way, it is advantageous to lower the field strength in discrete stages to a lower value, since the discretization of the individual field-strength values to be arrived at simplifies the triggering of the coils of the stepper motor.

If the time one takes to lower the field strength is longer than the duration of the mechanical time constant of the stepper motor, then the rotor of the stepper motor rotates between the exact instant when the rotor moment of rotation falls below the pointer moment of rotation and the instant when the magnetic field of the drive coils forces the rotating rotor into a stable position again, only by less than one complete rotation, before the rotor is again intercepted by the magnetic field of the drive coils. This means that the maximum rotational speed of the rotor is limited, resulting in the lowest possible pointer acceleration. Therefore, the degree that the pointer lifts up from the limit stop is minimized.

Lowering the drive voltage of the drive windings of the stepper motor represents a process for reducing field strength that is particularly simple and cost-effective to realize.

It is equally simple to reduce the pulse width of a pulse-width modulator connected in series to the drive windings, since the pulse-width modulator can also be triggered by digital signals, and because, given a spatial separation of the pulse-width modulator from the stepper motor, the pulse-width modulator can usually be equipped with a device for implementing the process less expensively than can the stepper motor.

One particularly advantageous realization for reducing the drive voltage, because it is an economical and simple, is to change the elementary value of at least one controllable impedance of an impedance circuit connected in series to the drive windings.

If one reduces the supply voltage of a stepper-motor driver connected in series to the stepper motor, then one attains the advantage that the circuit provided for reducing the supply voltage can be arranged directly on the spatially most favorably situated stepper-motor driver. Moreover, an arrangement can be realized for reducing the supply voltage, without making a change on the circuit of the stepper-motor driver itself or without having an influence on the method of functioning of the stepper-motor driver or of another subassembly connected in series to the stepper motor, such as the pulse-width modulator.

By reading the compensating angle of rotation out of a storage medium, one attains the advantage that the optimum compensating angle of rotation is able to be adjusted in each case for different stepper motors and different mechanical elasticities of the pointer, the gear unit, etc., as well as for different ambient conditions influencing the elasticities, simply by modifying the memory contents of the storage medium.

Selecting a low rotational speed for the movement of the pointer away from the stop means serves advantageously to produce a pointer performance that, subjectively, is agreeable to the person reading the dial, since a slow pointer movement has less of a conspicuous effect than a fast pointer movement.

Reducing the magnetic field strength during rotation by the compensating angle of rotation reduces the compensating angle of rotation necessary to completely relieve the mechanically strained system, through which means the switch-off process is shortened. Reducing the field strength of the magnetic field of the drive coils between the pointer's movement away (excursion) and the switching off of the stepper motor serves advantageously to reduce the strength of an uncontrolled pointer movement for the case when the compensating angle of rotation is selected to be too small.

Increasing the switch-off-time voltages offers the advantage that since the pointer rotational speed and, thus, also the rotor rotational speed is reduced because of the reduction in the pointer moment of rotation, given a system being relieved of stress, more time is available for a rotor movement, so that it is ensured by prolonging the switch-off time span that, in spite of a reduced rotational speed, the rotor moves by at least half of one rotor rotation in the direction of the pointer moment of rotation, so that when brought into circuit again, (switched-on again) the rotor is forced into a stable position where a smaller pointer moment of rotation occurs.

Stipulating that the shortest switch-off time span be selected to be less than the shortest possible time span in which the rotor of the stepper motor continues to move by one complete rotation, and that the longest switch-off time span be selected to be shorter than the longest possible time span in which the rotor of the stepper motor continues to move by one complete rotation, leads to the advantage that the rotor continues to move during the switch-off time span by less than one rotor rotation, through which means the thereby occurring maximum rotor rotational speed is limited.

In addition, it proves to be advantageous when the sum of the switch-on time span and the preceding switch-off time span is selected to be greater than the time span in which the rotor of the stepper motor continues to move in this time period by one complete rotation, since by this means, following the rotation during the switch-off time span, the rotor is so heavily braked during the switch-on time span that, for the next rotation, the moment of inertia of the rotor is also to be overcome, through which means the maximum rotational speed of the rotor is likewise reduced.

BRIEF DESCRIPTION OF THE DRAWINGS

FIG. 10 shows an example of the characteristic curve of the field directions of the magnetic field of the drive coils when the rotor moves by a compensating angle of rotation;

FIG. 11 shows the characteristic curve of the angle of rotation for the characteristic curve of the field directions of the magnetic field of the drive coils depicted in FIG. 10;

FIG. 12 shows the characteristic curve of the rotor moment of rotation for the characteristic curve of the field directions of the magnetic field of the drive coils depicted in FIG. 10;

FIG. 13 shows the characteristic curve of the pointer moment of rotation for the characteristic curve of the field directions of the magnetic field of the drive coils depicted in FIG. 10;

FIG. 14 is an example of the stable and unstable positions of the pointer moment of rotation and of the rotor moment of rotation given a continuous lowering of the drive voltages;

FIG. 15 shows the characteristic curve of the drive voltages and of the pointer moment of rotation for the stable and unstable positions of the pointer moment of rotation and of the rotor moment of rotation depicted in FIG. 14;

FIG. 16 shows the characteristic curve of the angle of rotation for the stable and unstable positions of the pointer moment of rotation and of the rotor moment of rotation depicted in FIG. 14.

DETAILED DESCRIPTION OF THE INVENTION

Figure 1:
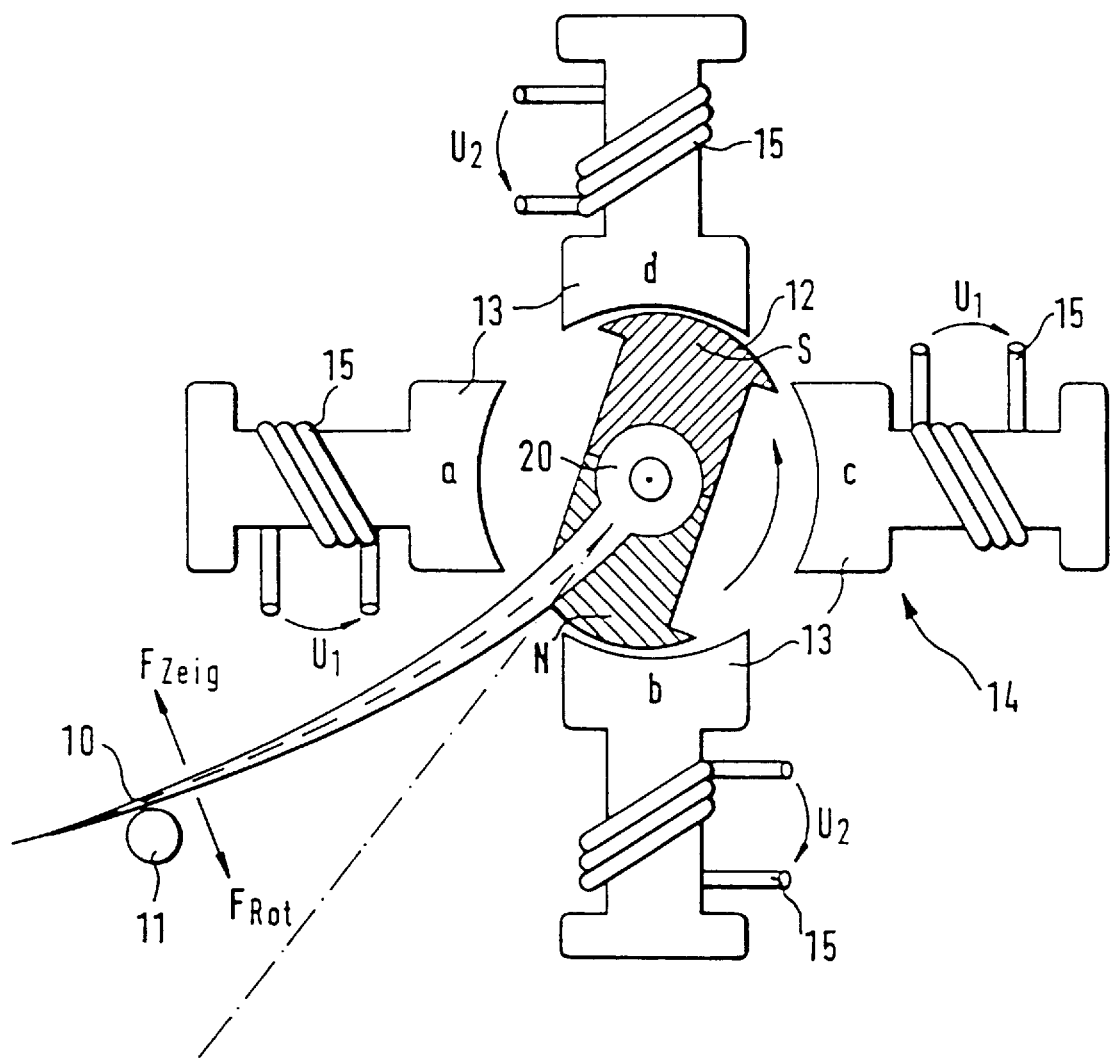
FIG. 1 shows a stepper motor with pointer.

FIG. 1 depicts the arrangement of a stepper motor 14. The stepper motor 14 has four coil cores 13, which are arranged on a first circular curve, offset from one another by 90 degrees. The coil curves 13 each have a drive coil 15. The ends of the coil cores 13 oppose one another in pairs and, at the front ends turned toward one another, each have a concave recess, the concave recesses of the four coil cores 13 making up another circular curve that is concentric to the first circular curve. A somewhat rectangular-shaped rotor 12 is rotationally mounted at the midpoint of these two circular curves around the intersection of its axes of symmetry situated at the midpoint and, at its ends, has convex bulges, the circular curve of the convex bulges, in turn, being concentric to the midpoint, and the radius of the convex bulges being more or less equal to the radius of the concave recess of the coil cores 13. The rotor 12 has a permanent-magnetic design and has a magnetic south pole and a magnetic north pole. The boundary line between the magnetic south pole and the magnetic north pole runs along the shortest axis of symmetry of the rotor 12, so that the magnetic south pole is situated at one end of the rotor 12, and the magnetic north pole at the other end of the rotor 12. A pointer 10 is mounted on a shaft 20, which runs through the axis of rotation of the rotor 12 and is rotatably fixed to the same. Given a counter-clockwise movement, the pointer 10 hits a mechanical stop means 11. A first drive voltage $U_1$ is able to be applied to two mutually opposing drive coils 15, and a second drive voltage $U_2$ is able to be applied to the second pair of mutually opposing drive coils 15. In addition, the coil cores 13 are each characterized by a characteristic letter "a", "b", "c", "d".

By applying the drive voltages $U_1$, $U_2$ in each case to one or both pairs of mutually opposing drive coils 15, a magnetic field can be produced in the area within the other circular curve which exerts an angular momentum on the rotor 12 and, by this means, sets the rotor 12 for so long into a rotation until the field direction of the magnetic field of the drive coils 15 is parallel to the field direction of the rotor 12, and the magnetic north pole of the rotor 12 is situated in front of the magnetic south pole of the magnetic field of the drive coils 15, provided that no further forces act on the rotor 12.

The characteristic letters "a", "b", "c", "d" serve in this case as direction indicators for facilitating the clarification of the method of functioning of the stepper motor 14 and the methods for reducing uncontrolled pointer movements. The following terminology is used in this case: the field direction of the magnetic field of the drive coils 15 has the direction "a" when the amplitude values of the drive voltages $U_1$, $U_2$ are so adjusted at the drive coils 15 that the magnetic south pole of the magnetic field of the drive coils 15 is situated in front of the coil core 13 characterized by the letter "a", i.e., that the magnetic north pole of the rotor 12 in front of the coil core 13, which is characterized by the letter "a", would move into a stable position, if no other forces, besides the force of the magnetic field of the drive coils 15, act on the rotor 12. The rotor 12 is then situated in the position "a" when its north pole is situated in front of the coil core 13 which is characterized by the letter "a". One position of the rotor 12 is designated then in this case as a "stable position" when it no longer changes with time given a constant adjustment of the amplitude values of the drive voltages $U_1$, $U_2$ and when, given a small deflection out of this position, the rotor 12 automatically moves back into this position again. In contrast to this, it is described as an "unstable position" of the rotor 12 when, in fact, the position no longer changes with time, given a constant adjustment of the amplitude values of the drive voltages $U_1$, $U_2$, but the rotor 12 would move further away from the position given a small deflection out of this position. An "unstable" position is a position in which the rotor 12 does not remain because of an imbalance (disequilibrium) of all moments of rotation acting on it, but rather, as time progresses, moves into another position. The moment of rotation, which acts through the magnetic field of the drive coils 15 on the rotor 12, is referred to as "rotor moment $M_{12}$".

At this point, FIG. 1 illustrates the case when the magnetic field of the drive coils 15 exerts a moment of rotation on the rotor 12, tending to move the rotor 12 counter-clockwise. However, the rotor 12 is hindered in its rotary motion by the mechanical stop means 11. The mechanical stop means 11, in turn, now exerts a moment of rotation referred to as "pointer moment $M_{10}$" on the pointer 10. When the drive voltages $U_1$, $U_2$ are applied, so that a field direction of the magnetic field of the drive coils 15 results in the direction "b", thus in the case of the field direction "b", the rotor 12 thus does not rotate with its magnetic north pole entirely in front of the coil core 13 with the letter "b", but rather remains in a stable position, which is remote from the position "b" by a differential angle. In this case, the differential angle is dependent, above all, on the elasticities of the pointer 10, the shaft 20, and the mechanical stop means 11. The stable position of the rotor 12 is characterized in that the pointer force $F_{Point}$ exerted by the mechanical stop means 11 on the pointer 10 is the same in magnitude as the rotor force $F_{Rot}$ exerted by the moment of rotation of the magnetic field of the drive coils 15 on the rotor 12 and, thus, via the shaft 20 on the pointer 10. If the drive voltage $U_1$, $U_2$ is retained in this manner, then the rotor 12 stops in this position. This position is the stable position, in which the two moments of rotation that are in equilibrium exhibit the maximum possible value at which an equilibrium is possible, and is referred to as "stable end position". Now, if the drive voltages $U_1$, $U_2$ are switched off all at once, then the sudden reduction in the rotor force $F_{Rot}$ would cause the pointer force $F_{Point}$ to be abruptly released, so that the pointer 10 would lift off in the clockwise direction from the stop means 11.

A gear unit is usually connected between the rotor 12 and the pointer 10, and its transformer ratio is such that the pointer 10 only moves by a fraction of the angle through which the rotor 12 moves. Also, such a gear unit usually has an elasticity that results mainly from the elasticity of the pinion used and because of the gear play. Such a gear unit also makes it possible now for the rotor 12 to rotate several times completely about itself between the instant that the pointer 10 hits against the mechanical stop means 11 and the instant the stable end position is reached. After the stable end position is reached, the drive of the stepper motor 14 is usually so altered that the magnetic field of the drive coils 15 no longer rotates, rather the magnetic field of the drive coils 15 is held fast in an angular position. The rotor 12 now remains in a stable position, which does not absolutely have to be identical to the stable end position. After that, the stepper motor 14 should be switched off, i.e., the amplitude values of the drive voltages $U_1$, $U_2$ are lowered to zero. The present invention comes into play at this point. The aim is for the stepper motor 14 to be switched off in a way that will allow an uncontrolled pointer movement, caused in all probability by an abrupt switch-off operation, to be reduced in strength or even completely avoided. Taking the place of the abrupt interruption of the drive voltages $U_1$, $U_2$ is a process by means of which the rotor force $F_{Rot}$ and, thus, also the pointer force $F_{Point}$ are reduced more slowly than in the case of the abrupt switch-off operation. The rotor 12 moves in this case with a limited speed, so that any visible lifting of the pointer 10 off of the mechanical stop means 11 is reduced to a minimum. The process is able to be broken down into three principal process types, which will now be elucidated one after the other.

Common to all types of processes is that the rotor 12 moves clockwise to slowly relieve the rotor force $F_{Rot}$. For all the diagrams shown in the other FIGS. 2 through 16, it is uniformly assumed that there is elasticity in the stepper motor 14, for example because of an intermediate gear, great enough to allow the rotor 12 to turn several times about itself counter-clockwise following the instant that the pointer 10 hits against the mechanical stop means 11, until the stable end position is reached. Conversely, therefore, several revolutions of the rotor 12 are required to enable a complete reduction in the pointer force $F_{Point}$.

Figure 2:
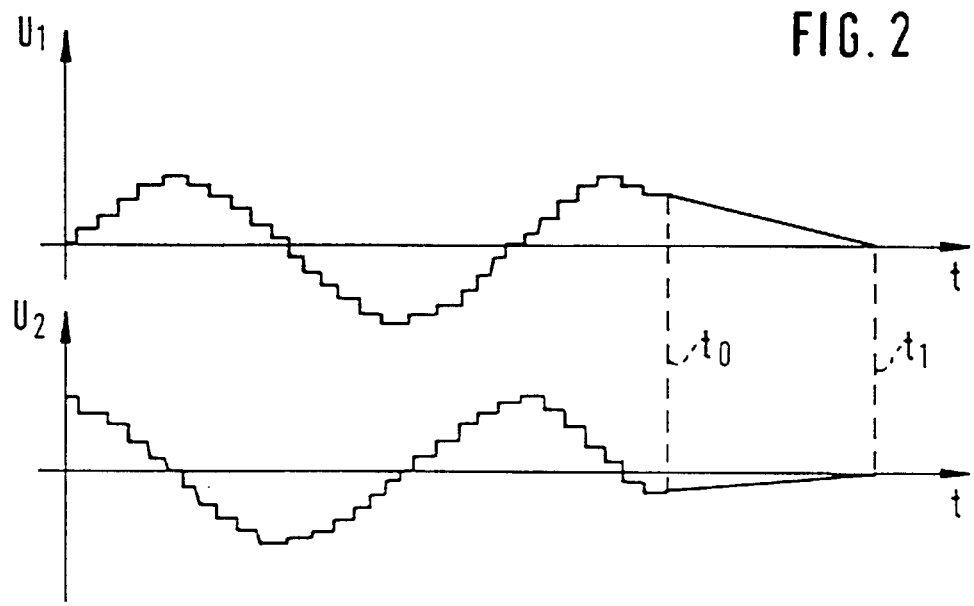
FIG. 2 shows the general characteristic curve of the drive voltages with a continuous lowering before being switched off.

The characteristic curve of the drive voltages $U_1$, $U_2$ for the first process type is depicted in FIG. 2. The amplitudes of the two drive voltages $U_1$, $U_2$ both run along a sine curve. The drive voltage $U_1$ is phase-displaced by 90 degrees from the drive voltage $U_2$. This produces a counter-clockwise rotation of the rotor 12. The rotor 12 is usually operated in microstep operation, i.e., the sine curves are approached in discrete steps, a step corresponding to a microstep. If, at this point, the pointer 10 hits against the mechanical stop means 11 at any instant at all, then the rotor 12 continues to rotate until the stable end position is reached and until the rotor moment of rotation $M_{12}$ exerted by the magnetic field of the drive coils 15 on the rotor 12 and also on the pointer 10 is equal to the pointer moment of rotation $M_{10}$ exerted by the mechanical stop means 11 on the pointer 10. The rotor 12 remains in this position, while the field direction of the magnetic field of the drive coils 15 continues to move counter-clockwise. The rotor 12 does not follow this field movement anymore. Since the rotor moment $M_{12}$ depends on the differential angle between the field direction of the magnetic field of the rotor 12 and the field direction of the magnetic field of the drive coils 15, the rotor 12 executes small pendulum motions that fluctuate about the stable end position. If the stepper motor 14 is now supposed to be switched off in this situation, then the rotation of the magnetic field of the drive coils 15 is initially stopped, in that the amplitude values of the drive voltages $U_1$, $U_2$ are kept constant over time. As a result, the rotor moment $M_{12}$ does not change any more and the pendulum motions of the rotor 12 die out. The rotor 12 moves into a stable position, where equilibrium of moment of rotation prevails. The then existing state of the stepper motor 14 is now used as a starting point for the three different process types. Characteristic of the first process type is the following sequence: from a starting instant $t_0$ on, the amplitude values of the drive voltages $U_1$, $U_2$ are continuously lowered. The phase relation of the two drive voltages $U_1$, $U_2$ to one another is no longer changed. By lowering the amplitudes of the drive voltages $U_1$, $U_2$, the rotor moment $M_{12}$ is diminished, through which means the pointer 10, following the pointer moment $M_{10}$ rotates clockwise. The pointer moment $M_{10}$ is then also reduced thereby. Both moments of rotation are, thus, reduced. Since the strength of an uncontrolled pointer movement, given an abrupt switching off of the stepper motor, depends on the magnitude of the pointer force $F_{Point}$ existing at this instant and, thus, on the pointer moment $M_{10}$, the strength of the uncontrolled pointer movement to be expected is likewise reduced. If one does not switch off the stepper motor 14 until after the drive voltages $U_1$, $U_2$ have been lowered to a smaller amplitude value, then the magnitude of an uncontrolled pointer movement is reduced. Preferably, the amplitudes of the drive voltages $U_1$, $U_2$ are completely lowered. At an end instant $t_1$, the amplitudes of the drive voltages $U_1$, $U_2$ are then both decreased to the value zero. In particular, by continuously lowering the drive voltages $U_1$, $U_2$ to the value zero, it can be achieved that no more uncontrolled pointer movement at all occurs. Further details on this first process type are elucidated on the basis of FIGS. 14 through 16.

Figure 3:
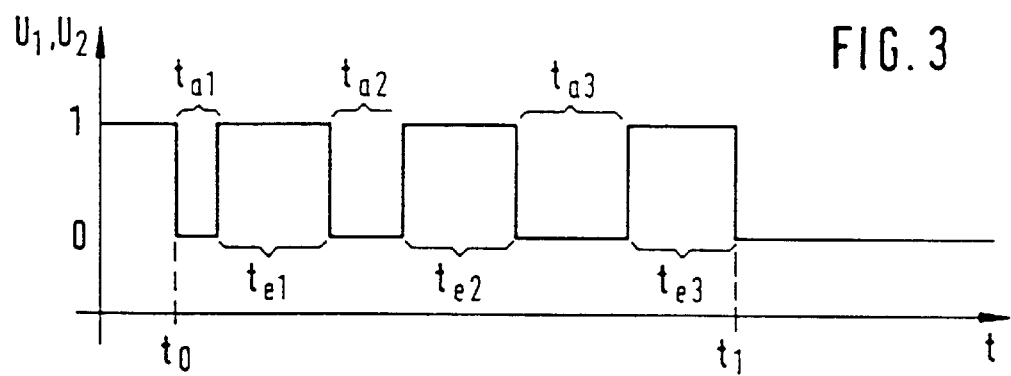
FIG. 3 shows the general characteristic curve of the drive voltages with repeated switching on and off.

As a second process type for relieving the pointer force $F_{Point}$, it is provided as shown in FIG. 3, from the starting instant $t_0$ on to switch off both drive voltages $U_1$, $U_2$ for a first switch-off time span $t_{a1}$ and, after that, to switch them on again for a first switch-on time span $t_{e1}$. More processes of this type follow with a second switch-off time span $t_{a2}$, a second switch-on time span $t_{e2}$, a third switch-off time span $t_{a3}$, and a third switch-on time span $t_{e3}$. After the third switch-on time span $t_{e3}$, the end instant $t_1$, is reached, and the stepper motor 14 is no longer switched on. During the switch-off time spans $t_{a1}$, $t_{a2}$, $t_{a3}$, the rotor 12 moves out of its stable position in the direction of the pointer force $F_{Point}$ and, during the switch-on time spans $t_{e1}$, $t_{e2}$, $t_{e3}$, is intercepted again by the magnetic field of the drive coils 15 of the again switched-on stepper motor 14 in a stable position with little rotor moment $M_{12}$ and is stabilized in this position. In this manner, with every rotor revolution, the rotor moment $M_{10}$ and, thus, also the pointer force $F_{Point}$ is diminished by a certain amount. The process controls the rotor revolutions as a function of time, so that they take place as controlled revolutions. Here, as well, the strength of an uncontrolled pointer movement to be expected is reduced by the step-by-step reduction in the pointer moment $M_{10}$. This process will be elucidated further on the basis of FIGS. 7 through 9.

Figure 4:
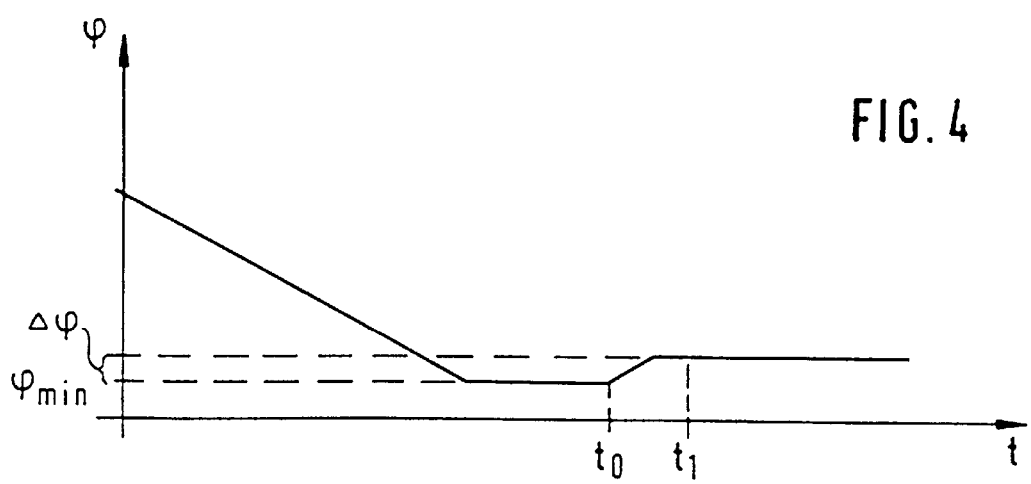
FIG. 4 shows the general characteristic curve of the angle of rotation with a movement by a compensating angle of rotation prior to the switch-off operation.

FIG. 4 shows the profile of the angle of rotation for the third process type. The angle of rotation $\phi$ of the rotor 12 diminishes as the rotor 12 moves counter-clockwise. As soon as the rotor 12 is decelerated to a standstill by the increasing pointer moment $M_{10}$ and is forced into the stable end position, a minimal angle of rotation $\phi_{min}$ is reached. The third process type now provides that, before the stepper motor 14 is switched off, the drive coils 15 are triggered, starting with the starting instant $t_0$, to move the rotor 12 clockwise with a reversal of direction by a compensating angle of rotation $\Delta\phi$, through which means the pointer force $F_{Point}$ is likewise reduced. In contrast to the rotation in the case of an abrupt switch-off operation, this rotation of the rotor 12 takes place as a controlled rotation. After the compensating angle of rotation $\Delta\phi$ is reached, the stepper motor 14 is switched off at the end instant $t_1$. Since the rotor 12 was moved prior to the switch-off operation by the compensating angle of rotation $\Delta\phi$, only a reduced pointer force $F_{Point}$ acts on the rotor 12 at the end instant $t_1$, through which means the strength of an uncontrolled lifting of the pointer 10 off of the mechanical stop means 11 is reduced. Optimally, the compensating angle of rotation $\Delta\phi$ is selected to be exactly large enough to allow the pointer moment $M_{10}$ to drop to the value zero. Further details on this process will be given on the basis of FIGS. 10 through 13.

Figure 5:
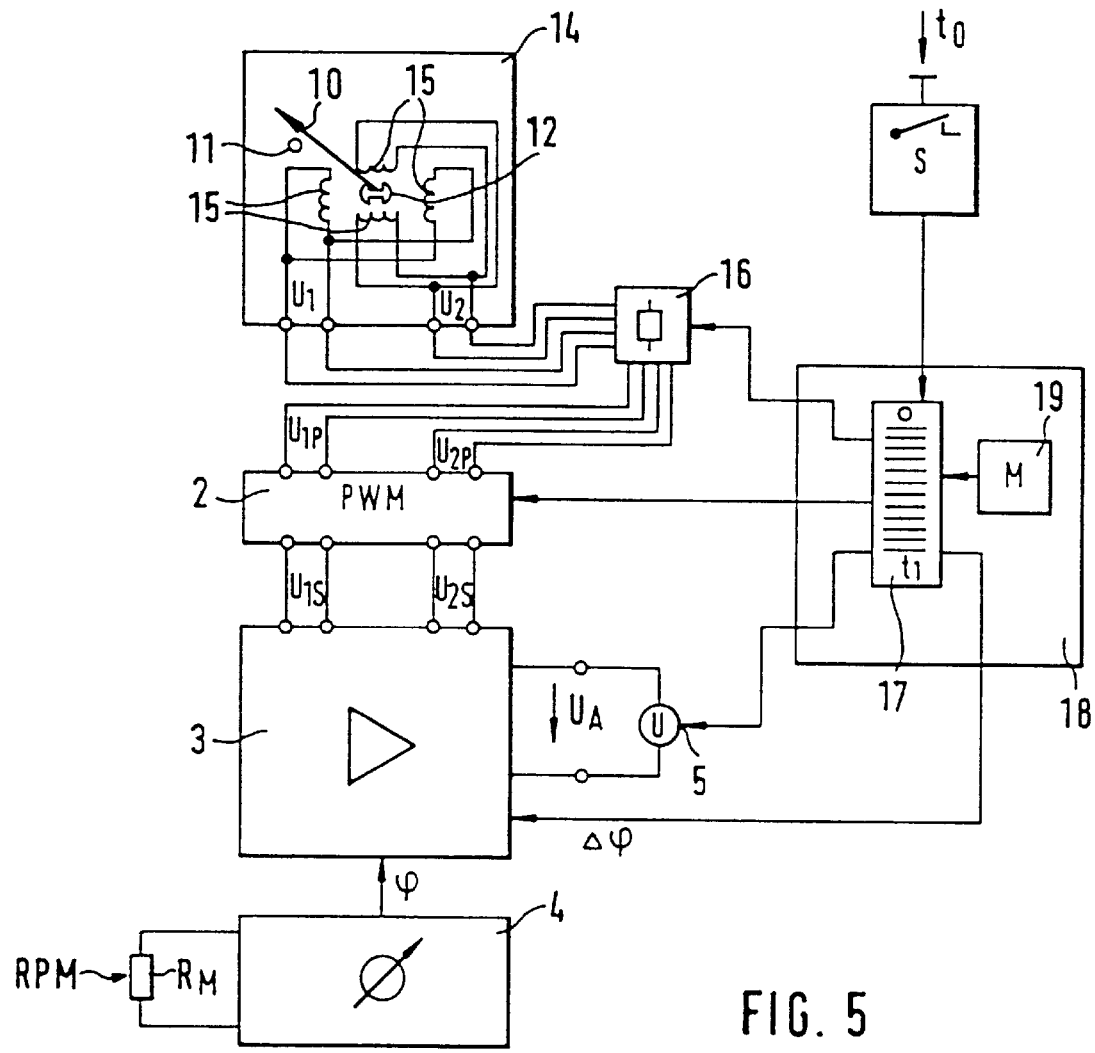
FIG. 5 shows a drive circuit for a stepper motor.

FIG. 5 depicts an arrangement as it is used for driving the stepper motor 14, in order to carry out the process. A measuring unit 4, which has a measuring resistor $R_M$, is connected in series to a stepper-motor driver 3. At its two outputs, the stepper-motor driver 3 supplies the driver voltages $U_{1s}$, $U_{2s}$ which are fed to a pulse-width modulator 2. Configured between the outputs of the pulse-width modulator 2, where the pulse-width modulated voltages $U_{1p}$, $U_{2p}$ are applied, and the inputs of the stepper motor 14, is an impedance circuit 16, to whose outputs the drive voltages $U_1$, $U_2$ are applied. Moreover, the stepper-motor driver 3 has two input connections which receive a supply voltage $U_A$ generated by a supply-voltage source 5. Also provided is a switch-off device 18, which has a storage medium 19 and a sequencing control 17. A switch S is connected to the sequencing control 17, which has four outputs, one of which is linked to the impedance circuit 16, one to the pulse-width modulator 2, the third to the supply-voltage source 5, and the fourth to the stepper-motor driver 3. The storage medium 19 is connected to the sequencing control 17.

By way of the measuring resistor $R_M$, the measuring unit 4 is used, for example, to measure a temperature or rotational speed RPM and to convert the determined measured value into an angle of rotation $\phi$ to be adjusted on the stepper motor 14. The value of the angle of rotation $\phi$ to be adjusted is communicated by the measuring unit 4 to the stepper-motor driver 3, which, in turn, converts the value of the angle of rotation $\phi$ to be adjusted into two corresponding values of the driver voltages $U_{1s}$, $U_{2s}$. The pulse-width modulator 2 converts the values of the driver voltages $U_{1s}$, $U_{2s}$ supplied to it into corresponding pulse-width-modulated drive voltages $U_{1p}$, $U_{2p}$. Via the impedance circuit 16, whose design is elucidated in conjunction with FIG. 6, the pulse-width-modulated drive voltages $U_{1p}$, $U_{2p}$ then attain the stepper motor 14, where the incoming voltage values for the drive voltages $U_1$, $U_2$ arrive at the drive coils 15 and effect a rotation of the pointer 10 that is mounted together with the rotor 12 on the shaft 20. After actuation of the switch S, the sequencing control 17 is now started, whereupon one or more of the three afore-mentioned process types are implemented before the stepper motor 14 is switched off. To reduce the field strength of the stepper motor 14 in accordance with the first process type, values of impedances existing in the impedance circuit 16 can be varied via the connection between the interrupting device 18 and the impedance circuit 16, in order to reduce the amplitudes of the drive voltages $U_1$, $U_2$. It is equally provided for the sequencing control 17 to effect a reduction in the pulse width of the pulse-width-modulated drive voltages $U_{1p}$, $U_{2p}$ in the pulse-width modulator 2. It is also provided for the field strength of the magnetic field of the drive coils 15 to be reduced in the stepper motor 14 in that the supply voltage $U_A$ of the stepper-motor driver 3 is decreased. All three courses of action, thus the influencing of the impedance circuit 16, of the pulse-width modulator 2, and of the stepper-motor driver 3 can thus be so controlled that the field strength 15 the magnetic field of the drive coils 15 is decreased continuously or in discrete steps to a lower value. In the same way, all three course of action can be so controlled that, switch-off and switch-on operations are realized in accordance with the second process type. The fourth output line of the sequencing control 17 is run directly to the stepper-motor driver 3, where the sequencing control 17 is able to influence the angle of rotation φ in accordance with the third process type. The sequencing control 17 initially extracts the value for the compensating angle of rotation Δφ from the storage medium 19 in order to then communicate it to the stepper-motor driver 3, whereupon said stepper-motor driver 3 drives the rotor 12 of the stepper motor 14, causing it to move by the compensating angle of rotation Δφ away from the mechanical stop means 11. The switch S is thereby actuated at the starting instant $t_0$, and the switch-off operation is ended by the sequencing control 17 at the final instant $t_1$. The sequencing control 17 is preferably so designed that the switch-off process is adapted to changeable environmental variables, such as temperature and moisture, influencing the elasticities of the strained elements. To this end, it must be ensured, of course, that the appropriate parameter values of the environmental variables from the measuring devices attain the sequencing control 17.

Figure 6:
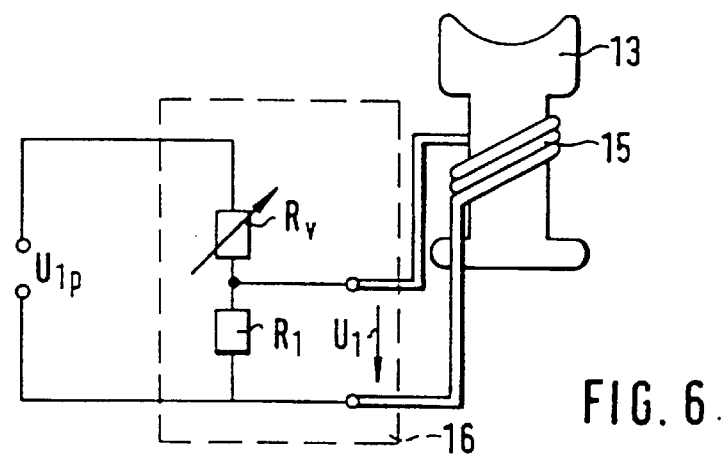
FIG. 6 shows an impedance circuit for triggering a drive coil.

A specific embodiment of the impedance circuit 16 is shown in FIG. 6. In this case, a voltage divider comprised of a divider resistor $R_1$ and a variable resistor $R_v$, are connected parallel to the input of the impedance circuit 16, where the pulse-width-modulated drive voltage $U_{1p}$, is applied. Connected parallel to the divider resistor $R_1$ is the drive coil 15, which is wound on the coil core 13. The two resistors $R_1$, $R_v$ make up the impedance circuit 16.

The voltage dropping across the divider resistor $R_1$ that forms the drive voltage $U_1$ for the drive coil 15 is able to be varied by changing the resistance value of the variable resistor $R_v$. Thus, through the sequencing control 17, the switch-off operation can effect a change in the value of the amplitude of the drive voltage $U_1$ by changing the resistance value of the variable resistor $R_v$.

Figure 7:
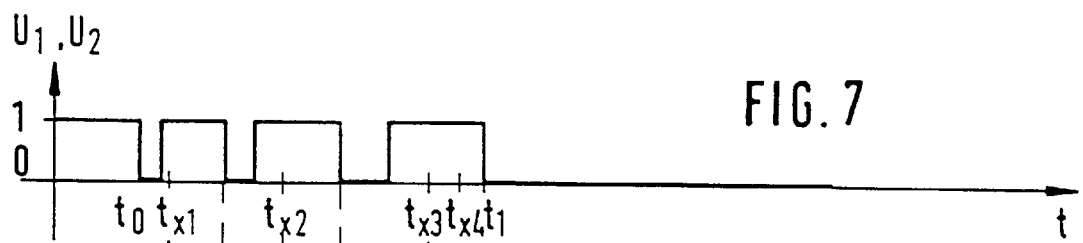
FIG. 7 shows an example of the characteristic curve of the drive voltages with repeated switching on and off.
Figure 8:
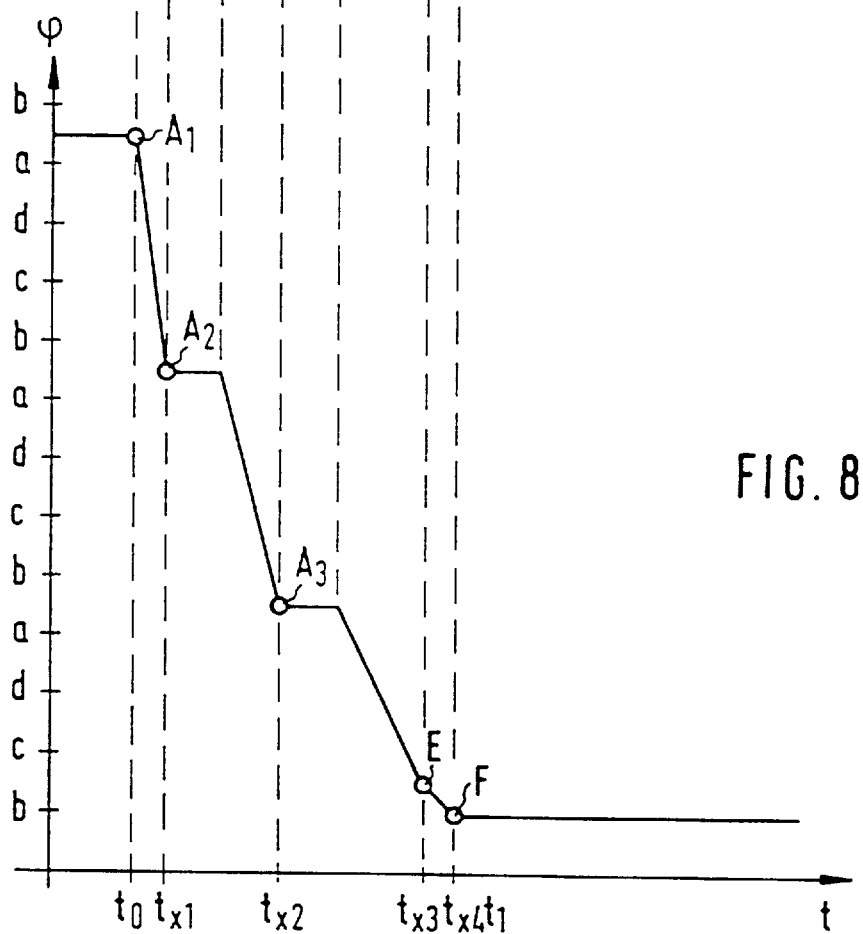
FIG. 8 shows the characteristic curve of the angle of rotation for the characteristic curve of the drive voltages depicted in FIG. 7.
Figure 9:
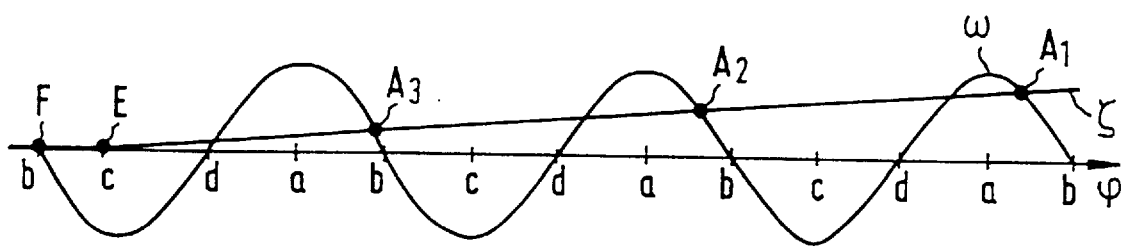
FIG. 9 shows the stable positions of the pointer moment of rotation and of the rotor moment of rotation for the characteristic curve of the drive voltages depicted in FIG. 7.

FIG. 7 depicts the voltage characteristic of the drive voltages $U_1$, $U_2$ for the second process type. The resulting characteristic of the angle of rotation φ of the rotor 12 is depicted in FIG. 8, and a diagram illustrating the stable positions on the basis of the moments $M_{10}$, $M_{12}$ of the pointer 10 and of the rotor 12 in FIG. 9. The method of functioning of the second process type shall now be elucidated on the basis of FIGS. 7, 8 and 9, considered together. One starts out from the assumption that prior to the starting instant $t_0$, the rotor 12 is situated in a stable position, which establishes the magnetic north pole of the rotor 12 between the positions "a" and "b". It is also assumed that the drive coils 15 carry current in such a way that their magnetic field has the tendency to turn the magnetic north pole of the rotor 12 into the position "b". For this second process type, this field direction "b" remains constant. A line ζ is sketched in FIG. 9, representing the idealized profile of the pointer moment $M_{10}$ in dependence upon the angle of rotation φ. The profile of the rotor moment $M_{12}$ is represented by the line ω. The stable position, in which the rotor 12 is situated prior to the starting instant $t_0$, is characterized by the characteristic letter "$A_1$". In the stable rest state between the positions "a" and "b", the pointer moment $M_{10}$ of the pointer 10 is exactly as great as the rotor moment $M_{12}$ of the rotor 12. The drive voltages $U_1$, $U_2$ are switched off at the starting instant $t_0$. The pointer moment $M_{10}$ then begins to rotate clockwise in the direction of the position "a" because of the switched-off magnetic field of the drive coils 15 of the stepper motor 14. The pointer 10 thereby passes over the positions "a", "d", "c" and "b", one after another. Between the instant when the pointer 10 passes position "a" and the instant when the pointer 10 passes position "b", the drive voltages $U_1$, $U_2$ are switched on again. The magnetic field of the drive coils 15 in the stepper motor 14 that is formed again in the stepper motor 14 then intercepts the rotary motion of the rotor 12 and, thus, also of the pointer 10 and forces the rotor 12 at a first capture instant $t_{x1}$ into a new stable position, which, in turn, lies between positions "a" and "b". Since the pointer moment $M_{10}$ was reduced during this rotation of the rotor 12, the new stable position "$A_2$" lies closer to the position "b". After the rotor 12 has been caught in the new stable position "$A_2$" by the magnetic field of the drive coils 15, the drive voltages $U_1$, $U_2$ are again switched off. A renewed operation then begins, in which the rotor 12 rotates past positions "a", "d", "c" and "b" to a third stable position "$A_3$". At a second capture instant $t_{x2}$, the rotor 12 is intercepted in the third stable position "$A_3$", since the magnetic field of the drive coils 15 was switched on by a renewed switching on of the drive voltages $U_1$, $U_2$ in time before the instant when the rotor 12 passes the position "b". The pointer moment $M_{10}$ was again reduced by this rotation of the rotor 12, causing the third stable position "$A_3$" to again lie closer to the position "b". With every rotation, the speed of rotation of the rotor 12 decreases because of the diminishing pointer moment $M_{10}$. This can be seen in FIG. 8 because the steepness of the steep edges between the stable positions "$A_1$", "$A_2$", and "$A_3$" decreases with rising time t and falling angle of rotation φ. A renewed switching off of the drive voltages $U_1$, $U_2$ effects a renewed rotation of the rotor 12, which, starting from the stable position "$A_3$" passes over the positions "a", "d", and "c"', one after another. After passing the position "c", the pointer moment $M_{10}$ drops to the value zero, i.e. the pointer 10 now abuts without pointer force $F_{Point}$ on the mechanical stop means 11. The unstable position in which the rotor 12 is situated at this first zero moment instant $t_{x3}$ bears the characteristic letter "E". However, since the stepper motor 14 is still switched on, the rotor moment $M_{12}$ still acts on the rotor 12 because of the differential angle between the positions "E" and "b". Thus, from the instant the unstable position "E" is reached on, merely the rotor moment $M_{12}$ still acts on the rotor 12. This rotor moment $M_{12}$ effects a rotation of the rotor 12 from the unstable position "E" to a stable position "F", which is identical to the stable position "b". Since no more moment of rotation acts on the rotor 12 in the stable position "F", the rotor 12 remains in the stable position "b". After the rotor 12 reaches the position "b" for the second zero-moment instant $t_{x4}$, the drive voltages $U_1$, $U_2$ are finally switched off at the final instant $t_1$. Any further switching on or switching off of the drive voltages $U_1$, $U_2$ would now be ineffective, and the pointer 10 would remain stopped in its position. Thus, the pointer moment $M_{10}$ was reduced step by step, the rotor 12 being able to rotate by a maximum of one revolution each time. When the pointer 10 is connected to the rotor 12 via the one reduction gear, the maximum rotation of the rotor 12 by one revolution effects a correspondingly small rotation of the pointer 10. In so doing, there is no disturbing lifting of the pointer 10 off of the mechanical stop means 11.

With respect to selecting the lengths of the switch-on time spans $t_{e1}$, $t_{e2}$, $t_{e3}$ and the switch-off time spans $t_{a1}$, $t_{a2}$, $t_{a3}$, the following information regarding dimensional design can be given: since the rotational speed of the rotor 12 likewise decreases with a diminishing pointer moment $M_{10}$, the switch-off time spans $t_{a1}$, $t_{a2}$, $t_{a3}$ that follow one another should be selected as increasing time spans. To nearly complete one rotation during one switch-off time span $t_{a1}$, $t_{a2}$, $t_{a3}$, the rotor 12 has to at least rotate past the position "a" during the switch-off time span $t_{a1}$, $t_{a2}$, $t_{a3}$, so that it is not pulled back again into its previous stable position during the repeated switch-on operation. On the other hand, the switch-off time span $t_{a1}$, $t_{a2}$, $t_{a3}$ should be selected to be short enough to allow the magnetic field of the drive coils 15 to be built up again during the subsequent switch-on time spans $t_{e1}$, $t_{e2}$, $t_{e3}$ in a timely fashion, so that the rotating rotor 12 will be intercepted by the magnetic field of the drive coils 15 in the next stable position, i.e., after somewhat less than one complete rotor rotation, and be forced into this stable position. The switch-on time span $t_{e1}$, $t_{e2}$, $t_{e3}$ should, in turn, be selected to be long enough to ensure an adequate deceleration (braking) of the rotating rotor 12 in the stable position. It is, thus, achieved that the rotor 12 does not still pick up energy from the just completed rotation for the next rotation, which would lead to an increase in the speed of the rotor 12 reached during the rotation. It is along the lines of the present invention to limit the maximum rotor speed to such a low value when the stepper motor 14 is switched off that, in the ideal case, no lifting off of the pointer 10 will result. With respect to the example shown in FIGS. 7 through 9, the switch-on time span $t_{e1}$, $t_{e2}$, $t_{e3}$ should begin after the instant when the rotor 10 reaches the position "a" and end after the instant when the rotor 10 reaches the position "$A_3$".

The time characteristic of the direction of the magnetic field of the drive coils 15 in the stepper motor 14 is depicted for the third process type in FIG. 10. FIG. 11 shows the corresponding characteristic of the angle of rotation φ of the rotor 12 on the basis of the curve β drawn in there. In addition, FIG. 12 depicts the approximate characteristic of the rotor moment $M_{12}$ and FIG. 13 the approximate characteristic of the pointer moment $M_{10}$. The third process type shall now be clarified on the basis of FIGS. 10 through 13.

As a starting point, one likewise assumes here that, prior to the starting instant $t_0$, the rotor 12 lies with its magnetic north pole between positions "a" and "b" in a stable position "$A_1$". The magnetic field of the drive coils 15 initially has the field direction "b". From the starting instant $t_0$ on, the field direction of the magnetic field of the drive coils 15 is now switched over, so that the new field direction of the magnetic field of the drive coils 15 points toward position "a". This corresponds to a full-step operation, which is assumed here to simplify clarification of the process sequence. However, the process type is equally suited for a micro-step operation. The field direction of the magnetic field of the drive coils 15 is switched over to reverse the operational sign of the rotor moment $M_{12}$, thus effecting a clockwise rotation of the rotor 12. The rotor 12 thereby passes the position "a" to arrive at a second stable position "$A_{11}$". The rotor moment $M_{12}$ is again at a constant value which is equal to the pointer moment $M_{10}$. The rotational speed of the rotor 12 does not increase as sharply as in the case of the first and second process type, since in this case the rotor completes less than one quarter of a rotation until it is decelerated again. To this end, the rotational frequency of the field direction of the magnetic field of the drive coils 15 is preferably selected to be lower than in a conventional rotational operation of the rotor 12 for displaying measured values on the dial. A further switching over of the field direction of the magnetic field of the drive coils 15 then follows in the direction of position "d", so that the rotor 12 once again rotates clockwise. The pointer moment $M_{10}$ drops, in turn, to a lower value, so that the result is, once again, a third stable position "$A_{12}$", given parity of the pointer moment $M_{10}$ and of the rotor moment $M_{12}$. Other changes in magnetic field direction follow over the positions "c" and "b". The rotor 12 thereby moves over the other stable positions "$A_{13}$" and "$A_{14}$". As soon as the pointer moment $M_{10}$ reaches the zero point, only the rotor moment $M_{12}$, which is exerted by the magnetic field of the drive coils 15 on the rotor 12 and which moves the rotor 12 into the magnetic field direction specified at the very moment by the drive coils 15, is still effective. At the instant when the rotor 12 turns in the direction of the last valid magnetic field direction, the rotor moment $M_{12}$ also drops to the value zero, so that no more moments at all act on the rotor 12. Therefore, the rotor 12 remains in the last stable position "$A_{15}$". Consequently, here as well, the pointer moment $M_{10}$ is reduced step by step from the maximum value in that the rotor 12 moves clockwise by the compensating angle of rotation Δφ away from the mechanical stop means 11. Here, as well, by a controlled reduction in the pointer moment $M_{10}$, one can prevent the pointer 10 from lifting off of the mechanical stop means 11. Thus, the strength of an uncontrolled pointer movement to be expected when the stepper motor 14 is switched off is reduced. Ideally, the rotor 12 is rotated clockwise to exactly where the pointer moment $M_{10}$ is zero. The stepper motor 14 can then be switched off without causing an uncontrolled pointer movement.

It is also provided to employ the third process type in combination with the first or second process type in that, in addition to the movement by the compensating angle of rotation Δφ, the amplitude of the drive voltages $U_1$, $U_2$ is reduced or alternating switch-off and switch-on operations follow. By this means, the switch-off operation can be additionally shortened.

Sketched in FIG. 14 for the first process type is the characteristic curve of the pointer moment $M_{10}$ on the basis of the line ζ and the characteristic curve of the rotor moment $M_{12}$ on the basis of the lines $\gamma_1$, $\gamma_2$, $\gamma_3$, and $\gamma_4$. The corresponding characteristic of the amplitudes of the drive voltages $U_1$, $U_2$, as well as the approximate characteristic curve of the pointer moment $M_{10}$ is plotted in FIG. 15. FIG. 16 depicts the corresponding characteristic curve of the angle of rotation φ of the rotor 12. The functional sequence of the first process type shall be elucidated on the basis of FIGS. 14, 15 and 16.

Once again, the starting position that applies is the rotor 12 remaining in the stable position "$A_1$" between positions "a" and "b". The field direction of the magnetic field of the drive coils 15 remains in the direction of position "b" during the entire process. The amplitude of the drive voltages $U_1$, $U_2$ at the starting instant $t_0$ begins to fall off continuously in a ramp shape. From this, a continuous weakening in the magnetic field of the drive coils 15 results, through which means the rotor 12 moves clockwise, following the pointer moment $M_{10}$. In so doing, the pointer moment $M_{10}$ is also reduced. The movement from the stable position "$A_1$" up to position "a" is shown in FIG. 14. The amplitude of the drive voltages $U_1$, $U_2$ is so lowered that the rotor moment $M_{12}$ changes from the characteristic curve of the initial curve $\gamma_1$ to the characteristic of the curve $\chi_2$. The pointer moment $M_{12}$ thereby wanders along the line $\zeta$ from the stable position "$A_1$" to the unstable position "$D_1$". As soon as the unstable position "$D_1$" is reached, every further reduction in the field strength of the magnetic field of the drive coils 15 would effect a reduction in the rotor moment $M_{12}$ that is effective on the rotor 12. Accordingly, the rotor 12 pulls out of this unstable position "$D_1$" and rotates past the positions "d", "c" and "b" into a second stable position "$A_2$". This position follows, in turn, from the intersection of the line $\zeta$ with the rotor moment $M_{12}$ represented by the line $\gamma_2$. Given a small drop in speed, the rotor speed between positions "$A_1$" and "$D_1$" is thereby comparatively lower than the rotor speed between positions "$D_1$" and "$A_2$", since in the first case the rotor speed is determined by the speed of the drop in amplitudes of the drive voltages $U_1$, $U_2$ and, in the second case, by the mechanical time constant of the rotor 12. The mechanical time constant is thereby equal to the reciprocal value of the natural frequency of the rotor 12 under operational conditions. This natural frequency also depends, of course, on the mechanical elements coupled to the rotor 12, such as the shaft 20, perhaps a gear, and also upon the pointer 10, and determines the oscillation build-up characteristics of the rotor 12. By selecting a low reducing speed, the rotor 12 is again decelerated after nearly one rotation, similarly to the method of the switch-on phase used in the second process type. Once again, the lowering in the amplitudes of the drive voltages $U_1$, $U_2$ effects a slower rotation of the rotor from the stable position "$A_2$" to a second unstable position "$D_2$" when the rotor moment $M_{12}$ in position "a" is exactly the same as the pointer moment $M_{10}$. In this case, the rotor moment $M_{12}$ is represented by the line $\gamma_3$ in FIG. 14. Here, as well, the rotor 12 once again pulls out of the unstable position "$D_2$" and passes over the positions "d", "c" and "b" up to the third stable position "$A_3$". Many other such processes follow over positions "$D_3$", "$A_4$", "$D_4$", "$A_5$", "$D_5$" until the pointer moment $M_{10}$ again drops to the value zero. The rotor 12 is then in the unstable position "E". In this unstable position "E", no more pointer moment $M_{10}$ acts on the rotor 12, rather merely the component of the rotor moment $M_{12}$ still existing at this instant. The residual rotor moment $M_{12}$ rotates the rotor 12 out of the unstable position "E" into the final stable position "F", which is characterized in that the magnetic north pole of the rotor 12 is situated in front of the position "b". The rotor 12 remains there until the amplitudes of the drive voltages $U_1$, $U_2$ are lowered to zero and the final instant $t_1$ is reached. Since the amplitudes of the drive voltages $U_1$, $U_2$ already have the value zero, the stepper motor 14 is already switched off. What is achieved in this first process type is that the rotor 12 alternately executes slow and fast movements, the fast rotations being limited to a maximum of one rotor rotation, so that the speed of the rotor 12 cannot rise uncontrollably and lead to a lifting of the pointer 10 off of the mechanical stop means 11. It is not absolutely necessary for the lowering of the field strength of the magnetic field of the drive coils 15 to continue completely to the value zero. A reduction in the strength of an uncontrolled pointer movement is already achieved by the lowering of the rotor moment $M_{12}$ during the movement of the rotor 12 from an unstable position into a stable position. However, the more such processes take place prior to an abrupt switch-off operation, all the less intense this strength will be.

Consequently, all three process types have in common that the pointer moment $M_{10}$ is reduced controllably, so that there is no or only a hardly visible lifting of the pointer 10 off of the mechanical stop means 11. It is likewise provided to combine the three process types with one another and, thus, to arrive at a solution adapted to the specific application case. In particular, this enables the rotor 12 to be initially moved, for example, by a compensating angle of rotation $\Delta\phi$ away from the mechanical stop means 11 and for the amplitudes of the drive voltages $U_I$, $U_2$ to then either be diminished in a ramp shape or for the pointer moment $M_{10}$ to be reduced through a plurality of switch-on and switch-off operations.

The stepper motor 14 depicted and considered in FIGS. 1 through 16 has four drive coils 15 and four coil cores 13. However, the process is equally suited for every other type of stepper motor 14. Thus, the process is likewise applicable to a known stepper motor 14, for example, which has only two drive coils 15, whose coil cores 13 have a C-shaped design and are so interconnected to a limb of the coil core 13 that only three faces of a coil core 13 are arranged on the circular curve, offset from one another in 120° angles.

The pointer 10 is generally understood along the lines of the present invention to be a lever mounted more or less in a direction normal to the shaft 20. This lever does not necessarily have to be used to display the angle of rotation $\phi$. It is provided, for example, to mount on the shaft 20, a first pointer 10 of a rigid material, such as steel or another metal which strikes against the mechanical stop means 11, while another pointer 10 indicating the angle of rotation $\phi$ and usually fabricated from a transparent plastic is likewise secured to the shaft 20. By this means, the disturbing high elasticity of the pointer 10 indicating the angle of rotation $\phi$ is replaced by the low elasticity of the first pointer 10, which results in a stable end position with a small pointer moment $M_{10}$.

Alternatively to the above described processes, other process types can also be used to diminish any jumping of the pointer 10 off of the stop means 11, thus, for example, to reduce the pointer speed when it approaches the stop means 11.

What is claimed is:

1. A process for reducing the strength of an uncontrolled pointer movement, comprising the steps of:

rotating a pointer with a rotor of a stepper motor to reach a mechanical stop;

switching off the stepper motor for a predetermined switch-off time;

only after the pointer contacts the mechanical stop and after the stepper motor is switched off, reducing a springing action of the pointer off of the mechanical stop by switching on the stepper motor for a predetermined switch-on time; and switching off the stepper motor after the predetermined switch-on time.

2. The process of claim 1, wherein the predetermined switch-on time includes a plurality of predetermined periods, each of the plurality of predetermined periods being greater than a previous one of the plurality of predetermined periods.

3. The process of claim 2, wherein a minimum one of the plurality of predetermined periods is less than a minimum time span for the rotor of the stepper motor to move a complete rotation, and a maximum one of the plurality of predetermined periods in less than a maximum time span for the rotor of the stepper motor to move the complete rotation.

4. The process of claim 3, wherein a sum of the predetermined switch-on time and the previous one of the plurality of predetermined periods is greater than a time for the rotor of the stepper motor to move the complete rotation.

5. A process for reducing the strength of an uncontrolled pointer movement, a stepper motor driving a pointer via a rotor, comprising the steps of:

only after the pointer contacts a mechanical stop, reducing a springing action of the pointer off of the mechanical stop by one of reducing a field strength of a magnetic field of the stepper motor acting on the rotor of the stepper motor to a predetermined value greater than zero, and rotating the rotor by a predetermined compensating angle of rotation; and switching off the stepper motor after the springing action is reduced.

6. The process of claim 5, wherein the field strength is reduced continuously to the predetermined value.

7. The process of claim 5, wherein the field strength is reduced in discrete steps to the predetermined value.

8. The process of claim 5, wherein the field strength is reduced to the predetermined value in a time greater than a duration of a mechanical time constant of the stepper motor.

9. The process of claim 5, wherein the field strength is reduced by reducing a drive voltage of drive windings of the stepper motor.

10. The process of claim 9, wherein the drive voltage of the drive windings of the stepper motor is reduced by lowering a pulse width of a pulse-width modulator connected in series to the drive winding.

11. The process of claim 9, wherein the drive voltage of the drive windings is reduced by altering an elementary value of at least one controllable impedance via an impedance circuit connected in series to the drive winding.

12. The process of claim 5, wherein the field strength is reduced by reducing a supply voltage from a stepper-motor driver connected in series to the stepper motor.

13. The process of claim 5, wherein a value of the predetermined compensation angle of rotation is read out of a storage medium.

14. The process of claim 5, wherein the step of rotating the rotor by the predetermined compensating angle of rotation is performed at a rotational frequency lower than a conventional rotational operation of the rotor.

15. The process of claim 5, wherein during the step of rotating the rotor, the field strength of the magnetic field of the stepper motor is reduced to the predetermined value.

16. The process of claim 5, wherein after the step of rotating the rotor, the field strength of the magnetic field of the stepper motor is reduced to the predetermined value.

* * * * *